(12) United States Patent
Bijvoet

(10) Patent No.: US 8,330,940 B2
(45) Date of Patent: Dec. 11, 2012

(54) LITHOGRAPHIC APPARATUS, DEVICE MANUFACTURING METHOD AND POSITION CONTROL METHOD

(75) Inventor: Dirk-Jan Bijvoet, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 559 days.

(21) Appl. No.: 12/580,082

(22) Filed: Oct. 15, 2009

(65) Prior Publication Data

US 2010/0102413 A1   Apr. 29, 2010

Related U.S. Application Data

(60) Provisional application No. 61/108,121, filed on Oct. 24, 2008.

(51) Int. Cl.
*G03B 27/62* (2006.01)
*G03B 27/32* (2006.01)
*G03B 27/42* (2006.01)
*G03B 27/58* (2006.01)

(52) U.S. Cl. .......... 355/75; 355/53; 355/72; 355/77

(58) Field of Classification Search .......... 355/52, 355/53, 72–77; 356/399–401; 430/5, 8, 430/22, 30, 311
See application file for complete search history.

(56) References Cited

U.S. PATENT DOCUMENTS

| | | | |
|---|---|---|---|
| 5,894,056 A * | 4/1999 | Kakizaki et al. | 430/5 |
| 5,920,378 A * | 7/1999 | Murakami et al. | 355/53 |
| 6,693,700 B2 * | 2/2004 | Shima | 355/53 |
| 6,847,433 B2 * | 1/2005 | White et al. | 355/72 |
| 2002/0001082 A1 * | 1/2002 | Akimoto et al. | 356/400 |
| 2002/0041380 A1 * | 4/2002 | Kwan | 356/616 |
| 2002/0067473 A1 * | 6/2002 | Deguchi et al. | 355/53 |
| 2003/0048960 A1 | 3/2003 | Outsuka | 382/294 |
| 2004/0179179 A1 * | 9/2004 | Terashima | 355/53 |
| 2004/0179192 A1 * | 9/2004 | Mizuno et al. | 356/139.1 |
| 2005/0117142 A1 * | 6/2005 | Heerens et al. | 355/75 |
| 2007/0099099 A1 * | 5/2007 | Onvlee et al. | 430/30 |
| 2009/0147236 A1 * | 6/2009 | De Vos et al. | 355/72 |

* cited by examiner

*Primary Examiner* — Toan Ton
*Assistant Examiner* — Christina Riddle
(74) *Attorney, Agent, or Firm* — Pillsbury Winthrop Shaw Pittman LLP

(57) ABSTRACT

A lithographic apparatus includes a support configured to support a patterning device, the patterning device configured to pattern a beam of radiation to form a patterned beam of radiation; a positioning device configured to move the support in a first direction; a measurement device configured to measure a relative position of the patterning device with respect to the support and to generate a measuring signal, the measurement device including a reference unit constructed and arranged to be coupled to the patterning device at a fixed relative position, and a position sensor configured to measure the position of the reference unit with respect to the support, wherein the positioning device is constructed and arranged to correct a position of the support based on the measuring signal.

19 Claims, 5 Drawing Sheets

US 8,330,940 B2

LITHOGRAPHIC APPARATUS, DEVICE MANUFACTURING METHOD AND POSITION CONTROL METHOD

CROSS REFERENCE TO RELATED APPLICATIONS

This application claims priority and benefit under 35 U.S.C. §119(e) to U.S. Provisional Patent Application No. 61/108,121, entitled "Lithographic Apparatus, Device Manufacturing Method and Position Control Method", filed on Oct. 24, 2008. The content of that application is incorporated herein in its entirety by reference.

FIELD

The present invention relates to a lithographic apparatus and methods.

BACKGROUND

A lithographic apparatus is a machine that applies a desired pattern onto a substrate, usually onto a target portion of the substrate. Such a lithographic apparatus is described in US 2003/0048960 A1. This lithographic apparatus can be used, for example, in the manufacture of integrated circuits (ICs). In that instance, a patterning device, which is alternatively referred to as a mask or a reticle, may be used to impart a beam of radiation with a pattern in its cross-section, the pattern corresponding to a circuit pattern to be formed on an individual layer of the IC. This pattern can be imaged or transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. In the known lithographic apparatus each target portion is irradiated by scanning the pattern through a radiation beam in a given direction (the "scanning"-direction) while synchronously scanning the substrate parallel or anti-parallel to this direction.

In the known lithographic apparatus the patterning device is coupled to the support structure by a supporting device. The supporting device is provided with a clamp area (e.g. a vacuum clamp) to hold the patterning device in place with respect to the support structure.

US 2003/0048960 A1 describes that there is a continuously increasing demand on higher accuracy in combination with higher throughput. In order to increase throughput, it is desirable to increase scan velocities, which consequently lead to higher scan accelerations and decelerations.

These higher accelerations and decelerations yield in an increased patterning device (nano) slip.

US 2003/0048960 A1 suggests additional linear encoder patterns, which are provided on the patterning device (e.g. reticle or mask). These encoder patterns are used for detecting relative displacement between the patterning device (e.g. mask or reticle) and the patterning device stage or support (e.g. reticle stage). This relative displacement is further used by a correction device to correct the position of e.g. the patterning device stage.

In the lithographic apparatus described in US 2003/0048960 A1, the linear encoder patterns are fixed to the patterning device. This is undesirable as only dedicated lithographic apparatus can cooperate with these devices.

SUMMARY

In an aspect of the invention, there is provided a lithographic apparatus wherein a measurement device includes a reference unit which is constructed and arranged to be coupled to the patterning device at a fixed relative position, wherein the measurement device comprises a position sensor configured to measure the position of the reference unit with respect to the support structure.

As the reference unit is constructed and arranged to be coupled to the patterning device, it is no longer required to permanently provide e.g. linear encoder patterns to the patterning device. As a result, there is no need to use dedicated lithographic apparatus that are configured to cooperate with these dedicated patterning devices.

According to a preferred embodiment of the invention, the reference unit is detachably mounted to the patterning device. This is beneficial because the reference unit can be coupled to any patterning device at a fixed relative position without any required modifications to this patterning device. Consequently, no dedicated lithographic apparatus are required to cooperate with these patterning devices.

In an aspect of the invention, there is provided a lithographic apparatus that includes a support configured to support a patterning device, the patterning device configured to pattern a beam of radiation to form a patterned beam of radiation; a positioning device configured to move the support in a first direction; a measurement device configured to measure a relative position of the patterning device with respect to the support and to generate a measuring signal, the measurement device including a reference unit constructed and arranged to be coupled to the patterning device at a fixed relative position, and a position sensor configured to measure the position of the reference unit with respect to the support, wherein the positioning device is constructed and arranged to correct a position of the support based on the measuring signal.

In another aspect of the invention, there is provided a device manufacturing method including positioning a support in a first direction, the support configured to support a patterning device, the patterning device configured to pattern a beam of radiation to form a patterned beam of radiation; measuring a relative position of the patterning device with respect to the support and generating a measuring signal with a measurement device, the measuring including measuring a position of a reference unit with respect to the support, the reference unit constructed and arranged to be coupled to the patterning device at a fixed relative position, and correcting a position of the support based on the measuring signal.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
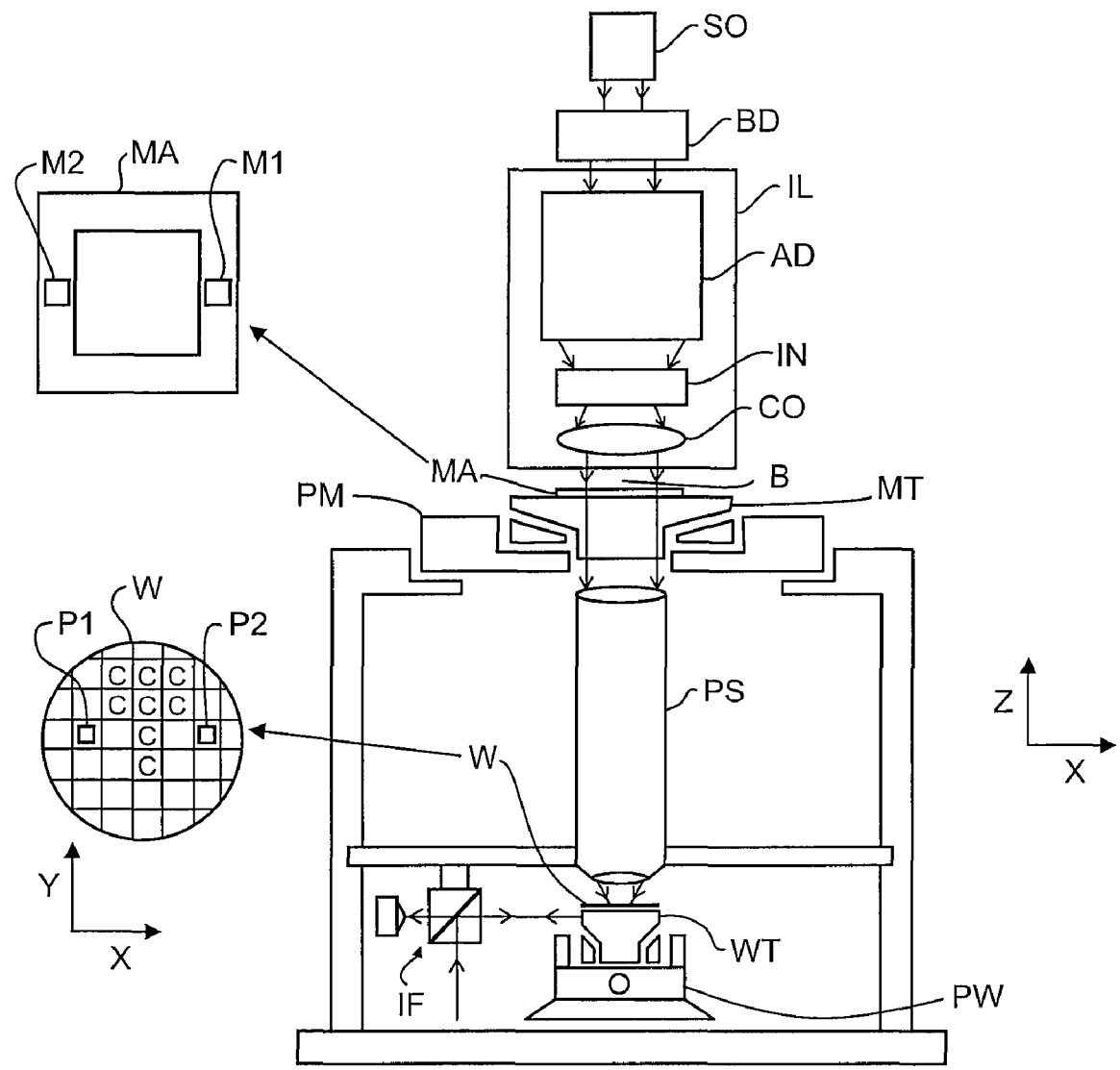
FIG. 1 schematically depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a patterning device support or support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may include an adjuster AD to adjust the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In certain applications, in particular in lithographic apparatus, there is a continuously increasing demand on higher accuracy in combination with higher throughput requirements. Increased throughput requires increasing scan velocities consequently leading to higher scan accelerations and decelerations. As a consequence, increased inertia forces may act on the patterning device support MT and the patterning device (e.g. mask) MA as shown in FIG. 1. When these inertia forces exceed the clamping force, slip may occur between the patterning device support MT and the patterning device MA resulting in a relative position displacement in the order of a few to more than 100 nanometers. Studies have demonstrated that patterning device (nano) slip occurs and increases due to increasing acceleration and deceleration levels of the patterning device support MT. Increasing clamping forces on the patterning device MA, in particular mechanical parts clamping or holding the patterning device MA during acceleration may result in internal stresses and/or deformations of the patterning device MA and are therefore undesirable. However, the avoidance of such mechanical parts increases the chance of the occurrence of slip between the patterning device support MT and the patterning device MA, which is especially undesired if this occurs during exposure scans.

Figure 2A:
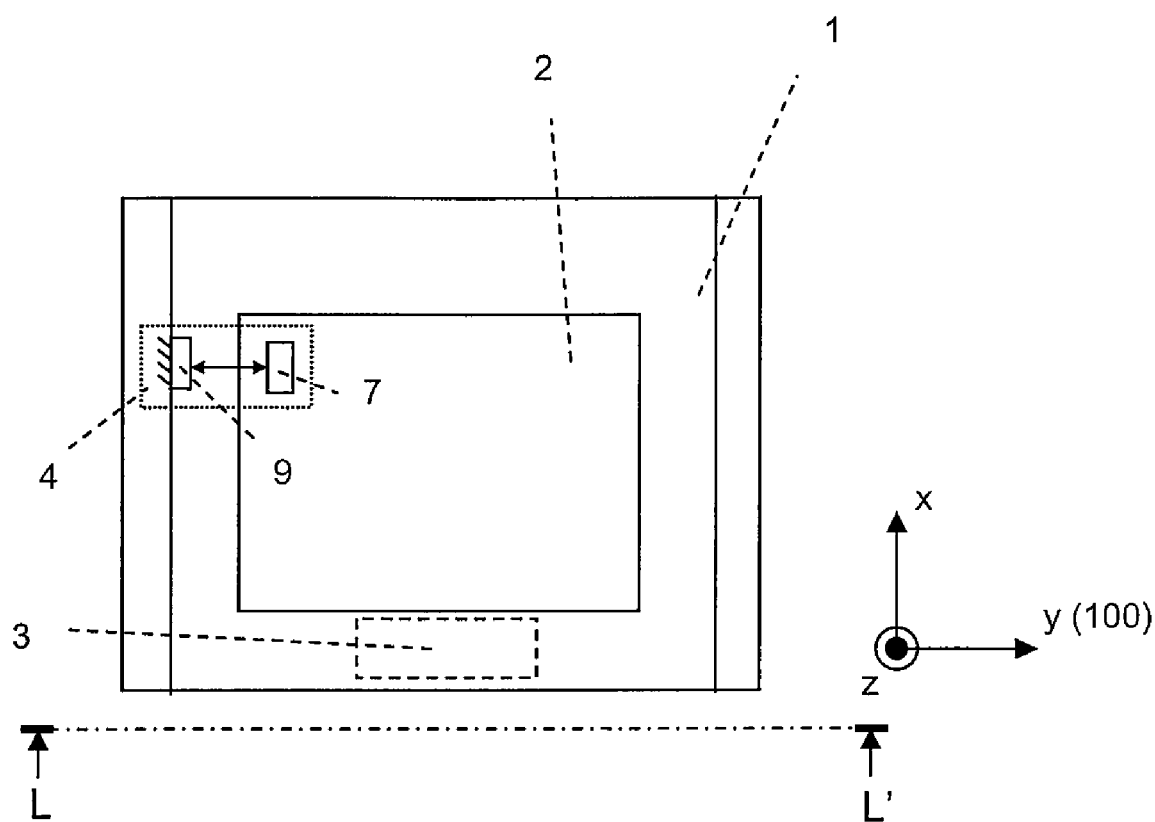
FIG. 2A is a schematic top view of a support structure holding the patterning device of the lithographic apparatus of FIG. 1.
Figure 2B:
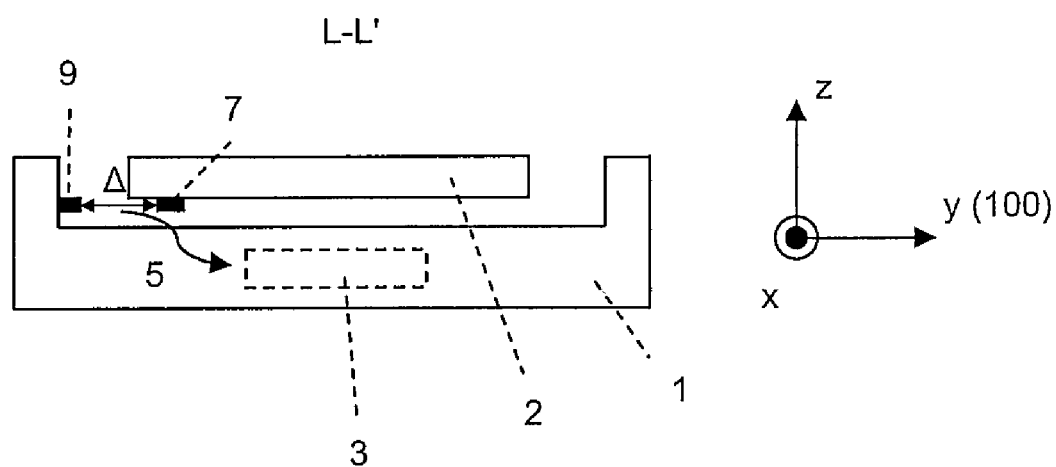
FIG. 2B is a schematic side view of the support structure holding the patterning device of FIG. 2A according to the line L-L'.

FIG. 2A shows a top view of the support structure supporting the patterning device 2. The support structure 1 is a patterning device support MT and the patterning device 2 is a mask MA. The positioning device 3 (e.g. a long stroke and/or short stroke motor) is provided to move the support structure 1 to the first direction 100. FIG. 2B shows a schematic side view of the patterning device support MT holding the mask MA of FIG. 2A according to the line L-L'. The measurement device 4 determines the relative position of the patterning device 2 with respect to the support structure 1 and generates a measuring signal 5. The position of the support structure 2 is corrected on the basis of the measuring signal 5. The measurement device 4 includes a reference unit 7 which is constructed and arranged to be coupled to the patterning device 2 at a fixed relative position. The measurement device 4 further includes a position sensor 9 to measure the position of the reference unit 7 with respect to the support structure 1. According to a preferred embodiment of the invention, the reference unit 7 is detachably mounted to the patterning device 2.

Figure 3:
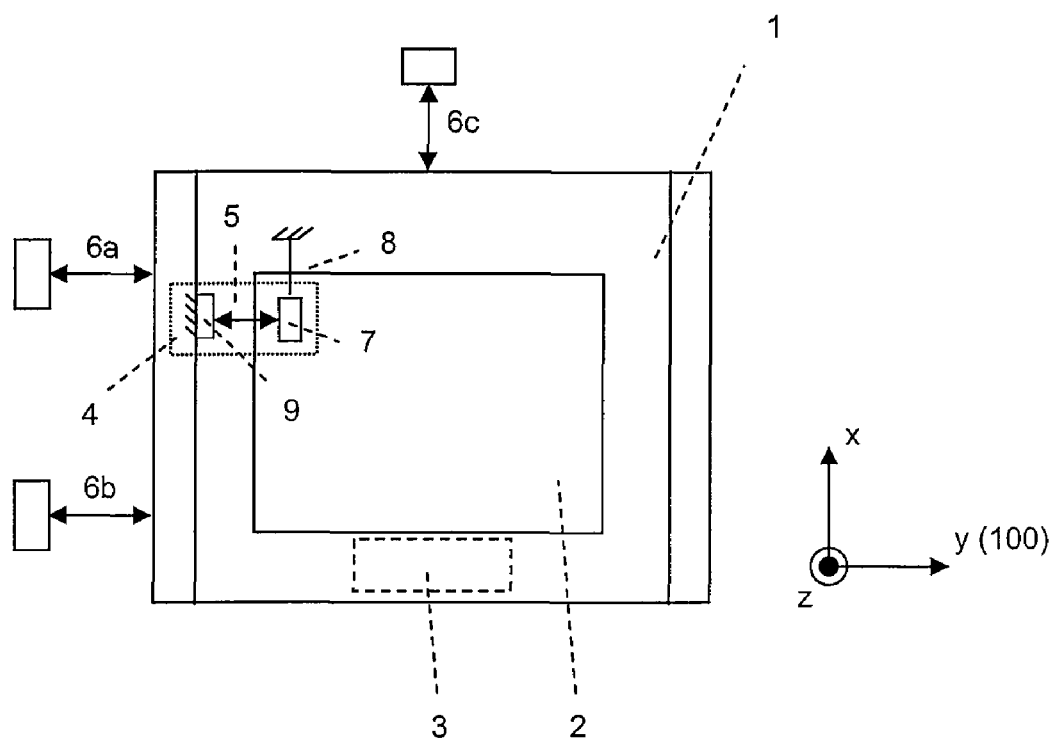
FIG. 3 is a schematic top view of a support structure positioned with respect to a reference frame according to an embodiment of the invention.

FIG. 3 indicates that the support structure 1 is constructed to move in one or more directions with relatively high accelerations with respect to a reference frame. The patterning device 2 may be clamped on the support structure 1 by a clamping device, such as a vacuum, electrostatic, magnetic or electromagnetic clamp (not shown).

The positioning device 3 is provided to move the patterning device support 1 to the first direction 100. This positioning device 3 may be any suitable type of actuator configured to move the patterning device support 1 with high precision to a desired position. The positioning device 3 may be configured to actuate the patterning device support 1 in one or more degrees of freedom or more actuators may be provided to make movements in the required degrees of freedom possible.

A position measurement system configured to measure the position of the patterning device support 1 with respect to a reference frame is provided. The position measurement system for measuring the patterning device support 1 includes two y-sensors 6a, 6b and an x-sensor 6c to measure the position of the patterning device support 1 in three coplanar degrees of freedom (x, y and Rz). This position measurement system may be used to measure the position of the patterning device support 1. In practice, the position measurement system may be any type of system suitable for measuring the actual position of the patterning device support, such as an interferometer measurement system or an encoder-type measurement system.

The measurement device 4 as shown in FIG. 3 includes a position sensor 9 to measure the position of the reference unit 7 with respect to the patterning device support 1. The position sensor 9 may be embodied in various ways, e.g. capacitive, inductive, optical sensors or other non-contacting position sensors. If the position sensor 9 would be in contact with the patterning device MA, then e.g. a piezo-electric sensor may be used. Using the measurement device 4 allows for a determination of a displacement, i.e. slip, of the patterning device MA relative to the patterning device support MT. The reference unit 7 may be any part of any suitable measurement device (e.g. a mirror, or a grating, or a receiver for an optical sensor, or a part of the capacitive or inductive sensor).

According to the current state of the art it should be noted that the feasible accuracy to place a patterning device MA on the patterning device support MT in the xy-plane is limited to approximately ±150 micrometers. Measuring the relative position of the patterning device MA with respect to the patterning device support MT with an accuracy of e.g. less than 0.5 nanometers may require sensors like e.g. laser interferometers and encoders. Such types of sensors may require modifications to the patterning device and as a consequence only dedicated lithographic apparatus can be used.

Figure 4:
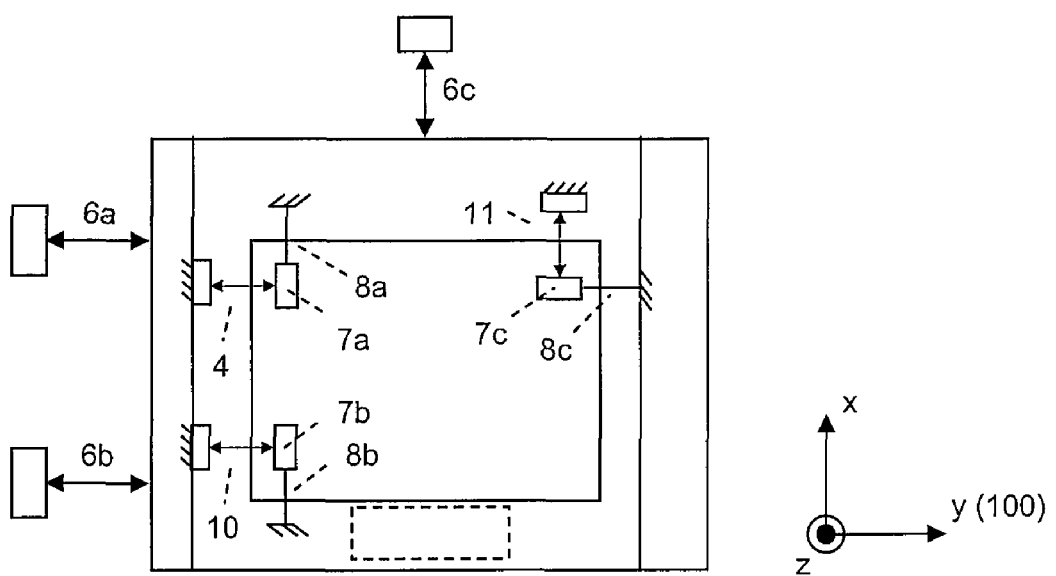
FIG. 4 is a schematic top view of the support structure positioned with respect to a reference frame according to an embodiment of the invention.

FIG. 4 shows an embodiment using additional measurement devices 10 and 11 providing relative displacement measurements in several directions (e.g. x, y and Rz). It will be appreciated that other sensor configurations and consequently other measurement directions are possible.

The measurement device 4 includes a reference unit 7a as a part of any suitable measurement device 4 as known in the art to determine the relative position of the patterning device MA with respect to the patterning device support MT. For this purpose, the position of the reference units (7a, 7b and 7c) might be provided to follow the position of the patterning device MA. This can be arranged by firmly attaching the reference units 7 to the patterning device MA by using e.g. a mechanical, vacuum, electrostatic or any other clamping technique. For this purpose the clamping force should exceed the force that is caused by moving the reference unit 7 from its neutral position, with respect to the patterning device support MT during the acceleration and deceleration phase of e.g. an exposure scan to prevent slip between these two parts.

This might be realized by attaching the reference unit 7 to connecting element 8 with a low stiffness in at least one direction to support the reference unit 7 with respect to the patterning device support MT when the reference unit 7 is not attached to the patterning device MA. A connecting element 8 with a low stiffness in at least one direction is a leaf spring, but there are other connecting elements known in the art with a low stiffness in more than one direction, like e.g. springs, rods, folded leaf springs, et cetera. A further elaboration of this idea is combining (more dimensional) low stiffness elements giving a wider range of all kind of possible combinations and directions to compensate for relative displacement of the patterning device MA with respect to the patterning device support MT. Preferable the stiffness of the connecting element 8 is low enough to follow the displacement of the patterning device MA with respect to the patterning device support MT.

The measurement device 4 may be provided with a position sensor 9 that corrects the position of the patterning device support MT on the basis of measuring signal 5. To perform this compensation, the position sensor 9 should be able to measure the position of the reference unit 7 with respect to the patterning device support MT. For this purpose all kind of measurement devices 4, e.g. capacitive, inductive, optical or other non-contact position sensors can be used. The possible range problem for such kind of sensors is no longer an issue, because the position of the reference unit 7 corresponds with the position of the patterning device MA. The possible offset between the patterning device support MT and the patterning device MA contributing in a large extent to the required measurement range substantially equals zero in an embodiment of the invention, because the measurement device 4 including the reference unit 7 are both connected to the patterning device support MT. As a consequence sensors like e.g.. interferometers or encoders are no longer needed allowing a much broader range of measurement devices. Because it is no longer necessary to use e.g. interferometers or encoders, specific modifications to the patterning device MA and as a consequence dedicated lithographic apparatus are no longer needed, while position corrections of the patterning device support MT to compensate for relative position changes between the patterning device support MT and the patterning device MA are possible while performing e.g. exposure scans.

Figure 5A:
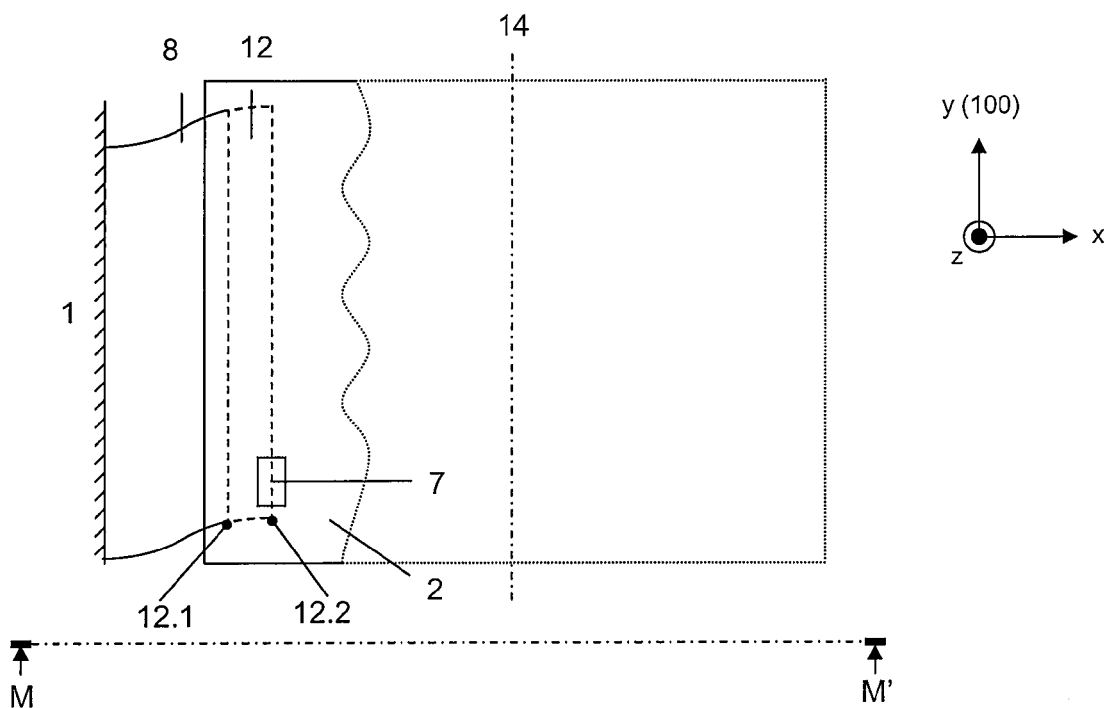
FIG. 5A is a schematic top view of an embodiment of the invention.
Figure 5B:
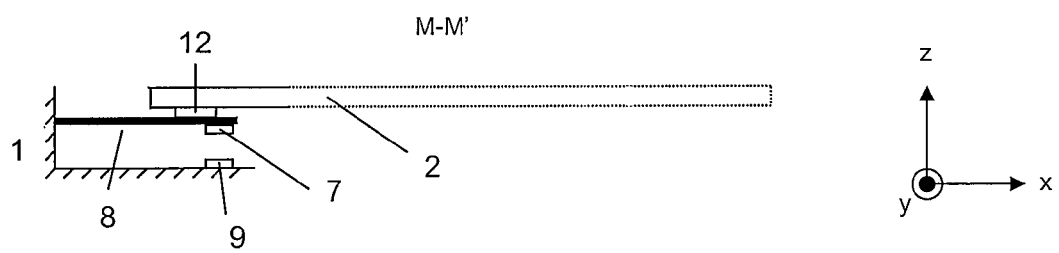
FIG. 5B is a schematic side view of the embodiment of the invention of FIG. 5A according to the line M-M'.

FIG. 5A shows a schematic top view, of an embodiment of the invention. In this embodiment the reference unit 7, for example a grating scale is placed at the inner-edge 12.2 of the clamp 12, wherein the inner-edge is defined as the edge of the clamp located nearest to the centerline 14 of the patterning device MA. FIG. 5B shows a schematic side view of the embodiment of the invention of FIG. 5A according to the line M-M'. Although slip between the patterning device support MT and the patterning device MA might occur at the outer-edge of the clamp 12.1 during acceleration and deceleration of the patterning device support MT, the inner-edge 12.2 of the clamp does not slip as shown in FIG. 5A. This further assures that the range of the measurement device 4 may be limited to the maximum expected deformation of the connecting element 8 and is also independent from the initial position of the patterning device MA. This enables the opportunity to apply all kind of measurement devices 4 to generate the measuring signal 5, like interferometers, optical, but also capacitive, inductive, et cetera without any modifications to the patterning device MA and as a consequence no dedicated lithographic apparatus have to be used.

Figure 6A:
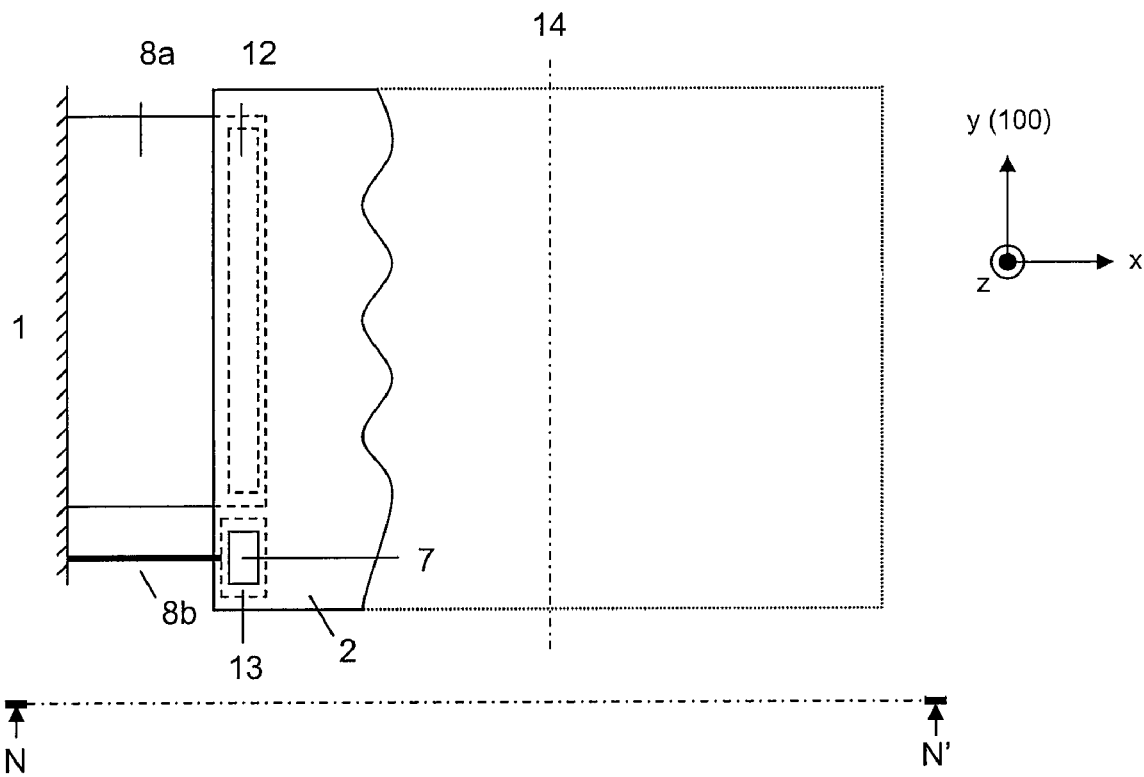
FIG. 6A is a schematic top view of an advanced embodiment of the invention.
Figure 6B:
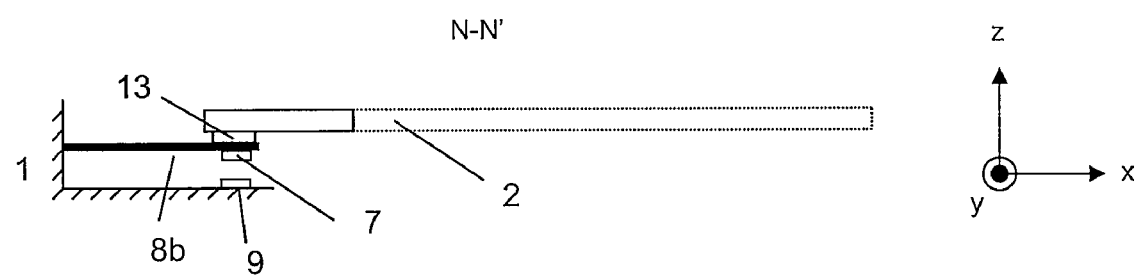
FIG. 6B is a schematic side view of the advanced embodiment of the invention of FIG. 6A according to the line N-N'.

FIG. 6A shows a schematic top view of an advanced embodiment of the invention. In this embodiment a part of the clamp area is separated by cutting it loose from the clamp 12 and the reference unit 7 is placed on a second and smaller clamp area 13. In this way it becomes a separate clamp area which is substantially free from shear forces due to patterning device support MT deformations due to acceleration and deceleration of the patterning device MA and the patterning device support MT itself. The second clamp area 13 is connected to the patterning device support MT by connecting element 8b. Because this connecting element has a low stiffness in preferably all directions, the second clamp area 13 should only provide enough clamp force to exceed the inertia forces due to acceleration and deceleration of the reference unit 7 and the second clamp area 13 and maybe a small additional force due to deformation of the low stiffness of connecting element 8. This assures that the position of the reference unit 7 is an accurate representation of the patterning device MA. A further benefit of this embodiment is that the reference unit 7 is detachable relative to the patterning device MA. This enables the opportunity to apply all kind of measurement devices 4 to generate the measuring signal 5, like interferometers, optical, but also capacitive, inductive, et cetera without any modifications to the patterning device MA and as a consequence no dedicated lithographic apparatus have to be used.

Although specific reference is made to the support structure being a patterning device support MT and the patterning device being a patterning device MA, the described invention may also relate to the support structure being a substrate device support WT and the patterning device being a substrate W or any other combination of bodies wherein a relative position between those bodies may be measured.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
a support configured to support a patterning device, the patterning device configured to pattern a beam of radiation to form a patterned beam of radiation;
a positioning device configured to move the support in a first direction;
a measurement device configured to measure a relative position of the patterning device with respect to the support and to generate a measuring signal, the measurement device comprising
a reference unit constructed and arranged to be coupled to the patterning device at a fixed relative position, and
a position sensor configured to measure the position of the reference unit with respect to the support,
wherein the positioning device is constructed and arranged to correct a position of the support based on the measuring signal, and
wherein the reference unit is detachable.

2. The lithographic apparatus according to claim 1, wherein the reference unit is connected to the support via a connecting element.

3. The lithographic apparatus according to claim 2, wherein the connecting element is compliant in a direction substantially perpendicular to the first direction.

4. The lithographic apparatus according to claim 3, wherein the first direction is a scan direction of the support.

5. The lithographic apparatus according to claim 2, wherein the connecting element is provided with a clamp area.

6. The lithographic apparatus according to claim 5, wherein the reference unit is connected at an inner edge of the clamp area.

7. The lithographic apparatus according to claim 1, wherein the reference unit is connected to the support via a connecting element, the connecting element being compliant in at least the first direction.

8. The lithographic apparatus according to claim 7, wherein the connecting element is provided with a clamp area.

9. The lithographic apparatus according to claim 1, wherein the patterning device is connected to the support via a connecting element which is provided with a clamp area.

10. The lithographic apparatus according to claim 1, wherein the positioning device is a long stroke motor or a short stroke motor.

11. The lithographic apparatus according to claim 1, wherein the position sensor includes a capacitive sensor, or an inductive sensor, or an optical sensor.

12. The lithographic apparatus according to claim 1, wherein the reference unit is a mirror or a grating.

13. A device manufacturing method comprising:
positioning a support in a first direction, the support configured to support a patterning device, the patterning device configured to pattern a beam of radiation to form a patterned beam of radiation;
measuring a relative position of the patterning device with respect to the support and generating a measuring signal with a measurement device, the measuring including
measuring a position of a reference unit with respect to the support, the reference unit being detachable and constructed and arranged to be coupled to the patterning device at a fixed relative position, and
correcting a position of the support based on the measuring signal.

14. The method according to claim 13, wherein the position of the reference unit with respect to the support is measured with a position sensor that includes a capacitive sensor, or an inductive sensor, or an optical sensor.

15. The method according to claim 13, wherein the reference unit is a mirror or a grating.

16. The method according to claim 13, wherein the reference unit is connected to the support via a connecting element.

17. The method according to claim 16, wherein the connecting element is compliant in a direction substantially perpendicular to the first direction.

18. The method according to claim 17, wherein the first direction is a scan direction of the support.

19. The method according to claim 16, wherein the connecting element is provided with a clamp area.

* * * * *